US009899267B1

(12) United States Patent
Liou et al.

(10) Patent No.: US 9,899,267 B1
(45) Date of Patent: Feb. 20, 2018

(54) SEMICONDUCTOR DEVICE AND MANUFACTURING METHOD THEREOF

(71) Applicant: UNITED MICROELECTRONICS CORP., Hsin-Chu (TW)

(72) Inventors: En-Chiuan Liou, Tainan (TW); Yu-Cheng Tung, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/390,527

(22) Filed: Dec. 25, 2016

(30) Foreign Application Priority Data

Nov. 23, 2016 (TW) .............................. 105138330 A

(51) Int. Cl.
*H01L 21/8238* (2006.01)
*H01L 21/70* (2006.01)
*H01L 21/8234* (2006.01)

(52) U.S. Cl.
CPC ............. *H01L 21/823481* (2013.01); *H01L 21/823878* (2013.01)

(58) Field of Classification Search
CPC ............. H01L 21/823481; H01L 21/823878
USPC ......... 257/374, 510, 513; 438/220, 296, 359
See application file for complete search history.

(56) References Cited

U.S. PATENT DOCUMENTS

| 7,132,333 B2* | 11/2006 | Schloesser ............ G11C 11/404 438/272 |
| 7,763,513 B2* | 7/2010 | Wang ................ H01L 21/28114 438/259 |
| 9,331,074 B1 | 5/2016 | Chang |
| 9,508,727 B2 | 11/2016 | Park |
| 2016/0133632 A1 | 5/2016 | Park |

* cited by examiner

*Primary Examiner* — Calvin Lee
(74) *Attorney, Agent, or Firm* — Winston Hsu

(57) ABSTRACT

A semiconductor device includes a semiconductor substrate, a shallow trench isolation structure, a plurality of gate electrodes, and a gate isolation structure. The semiconductor substrate includes a plurality of fin structures, and each of the fin structures is elongated in a first direction. The shallow trench isolation structure is disposed on the semiconductor substrate and disposed between the fin structures. The gate electrodes are disposed on the semiconductor substrate and the shallow trench isolation structure. Each of the gate electrodes is elongated in a second direction and disposed straddling at least one of the fin structures. The gate isolation structure is disposed between two adjacent gate electrodes in the second direction, and a bottom surface of the gate isolation structure is lower than a top surface of the shallow trench isolation structure.

12 Claims, 15 Drawing Sheets

SEMICONDUCTOR DEVICE AND MANUFACTURING METHOD THEREOF

BACKGROUND OF THE INVENTION

1. Field of the Invention

The present invention relates to a semiconductor device and a manufacturing method thereof, and more particularly, to a semiconductor device including a gate isolation structure and a manufacturing method thereof.

2. Description of the Prior Art

As the size of the field effect transistors (FETs) becomes smaller continuously, the conventional planar field effect transistor has difficulty in development because of the manufacturing limitations. Therefore, for overcoming the manufacturing limitations, the non-planar transistor technology such as fin field effect transistor (FinFET) technology is developed to replace the planar FET and becomes a development trend in the related industries. However, the manufacturing processes of the field effect transistors are more complicated relatively, and the related industries are endeavoring to simplify the processes and lower the manufacturing cost.

SUMMARY OF THE INVENTION

A semiconductor device and a manufacturing method thereof are provided in the present invention. A gate isolation structure disposed between two adjacent gate electrodes extends towards a semiconductor structure for being partly located below a top surface of a shallow trench isolation structure disposed on the semiconductor substrate. Accordingly, the gate isolation structure may be used to separate the gate electrodes and separate other units disposed on the semiconductor substrate and/or disposed in the semiconductor substrate, and the purposes of structure simplification and manufacturing process simplification may be achieved.

According to an embodiment of the present invention, a semiconductor device is provided. The semiconductor device includes a semiconductor substrate, a shallow trench isolation structure, a plurality of gate electrodes, and a gate isolation structure. The semiconductor substrate includes a plurality of fin structures, and each of the fin structures is elongated in a first direction. The shallow trench isolation structure is disposed on the semiconductor substrate and disposed between the fin structures. The gate electrodes are disposed on the semiconductor substrate and the shallow trench isolation structure. Each of the gate electrodes is elongated in a second direction and disposed straddling at least one of the fin structures. The gate isolation structure is disposed between two of the gate electrodes adjacent with one another in the second direction. A bottom surface of the gate isolation structure is lower than a top surface of the shallow trench isolation structure.

According to an embodiment of the present invention, a manufacturing method of a semiconductor device is provided. The manufacturing method includes the following steps. A semiconductor substrate is provided. The semiconductor substrate includes a plurality of fin structures, and each of the fin structures is elongated in a first direction. A shallow trench isolation structure is formed on the semiconductor substrate. The shallow trench isolation structure is located between the fin structures. A plurality of gate structures is formed on the semiconductor substrate and the shallow trench isolation structure. Each of the gate structures is elongated in a second direction and disposed straddling at least one of the fin structures. A gate isolation structure cutting at least one of the gate structures into two gate electrodes is formed. A bottom surface of the gate isolation structure is lower than a top surface of the shallow trench isolation structure.

In the semiconductor device and the manufacturing method thereof in the present invention, the gate isolation structure cuts at least one of the gate structures into two gate electrodes. The bottom surface of the gate isolation structure is lower than the top surface of the shallow trench isolation structure. Additionally, apart from separating the gate electrodes, the gate isolation structure extending towards the semiconductor substrate may be used to cut the fin structure in the semiconductor substrate for simplifying and integrating the related manufacturing processes.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-8 are schematic drawings illustrating a manufacturing method of a semiconductor device according to a first embodiment of the present invention, wherein FIG. 2 is a cross-sectional diagram taken along a line A-A' in FIG. 1, FIG. 3 is a schematic drawing in a step subsequent to FIG. 1, FIG. 4 is a cross-sectional diagram taken along a line B-B' in FIG. 3, FIG. 5 is a schematic drawing in a step subsequent to FIG. 3, FIG. 6 is a cross-sectional diagram taken along a line C-C' in FIG. 5, FIG. 7 is a schematic drawing in a step subsequent to FIG. 5, and FIG. 8 is a cross-sectional diagram taken along a line D-D' in FIG. 7.

FIG. 11 and FIG. 12 are schematic drawings illustrating a manufacturing method of a semiconductor device according to a fourth embodiment of the present invention, wherein FIG. 12 is a schematic drawing in a step subsequent to FIG. 11.

FIG. 15 and FIG. 16 are schematic drawings illustrating a semiconductor device according to a seventh embodiment of the present invention, wherein FIG. 16 is a cross-sectional diagram taken along a line E-E' in FIG. 15.

DETAILED DESCRIPTION

Figure 1:
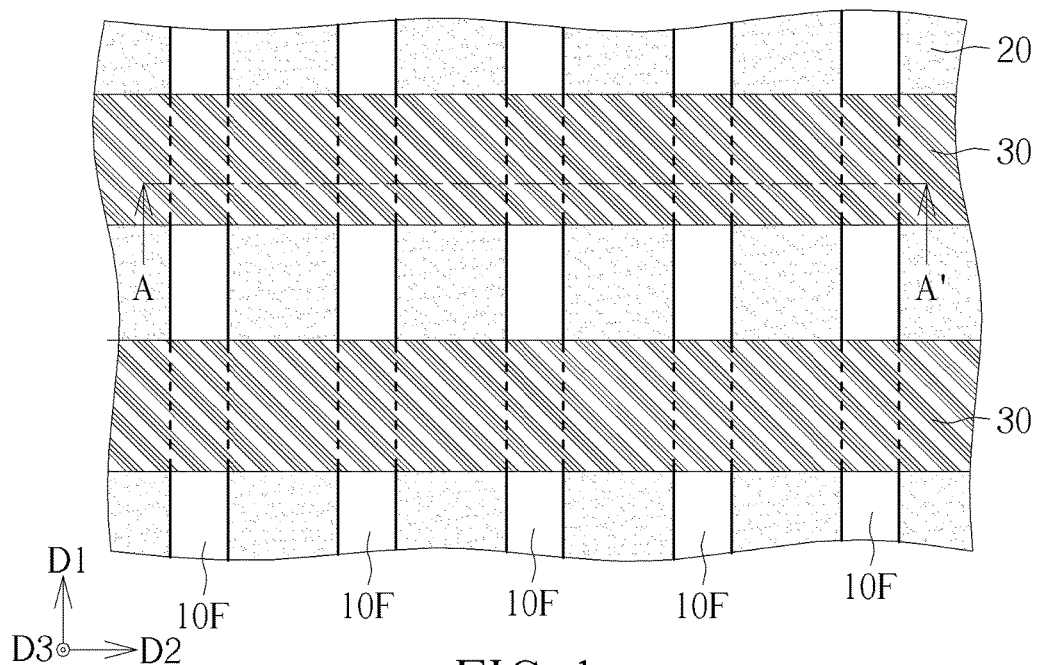
Figure 2:
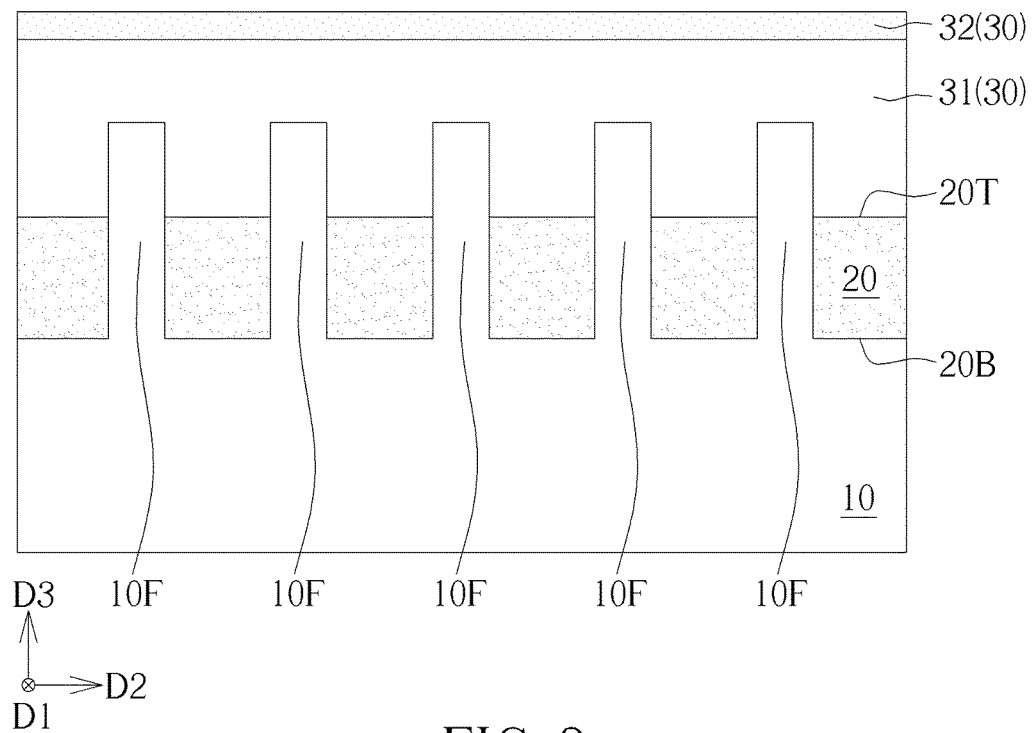
Figure 3:
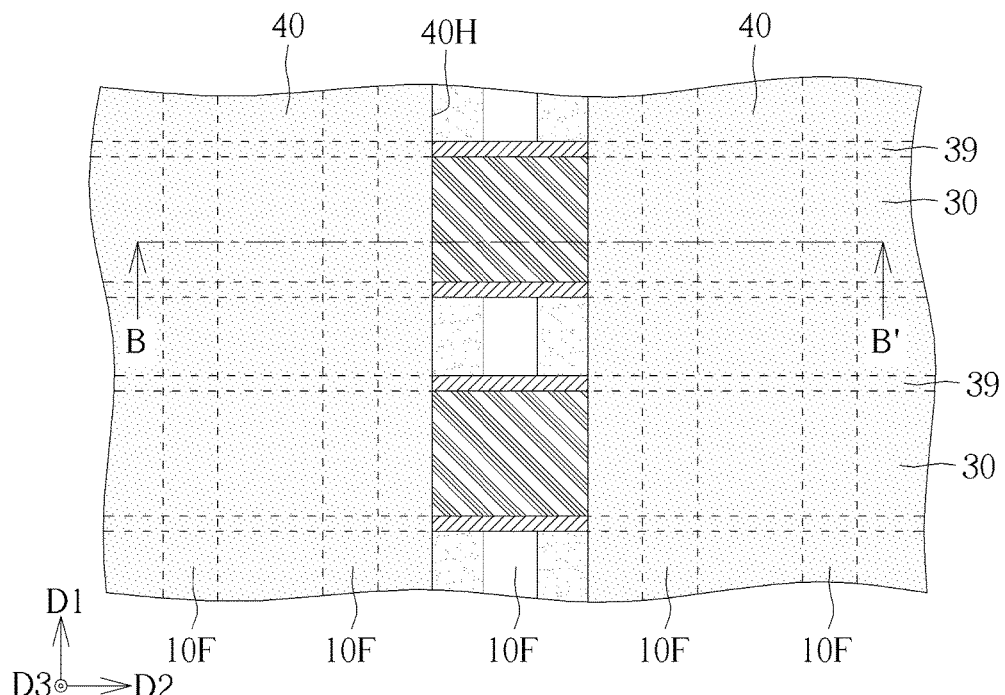
Figure 4:
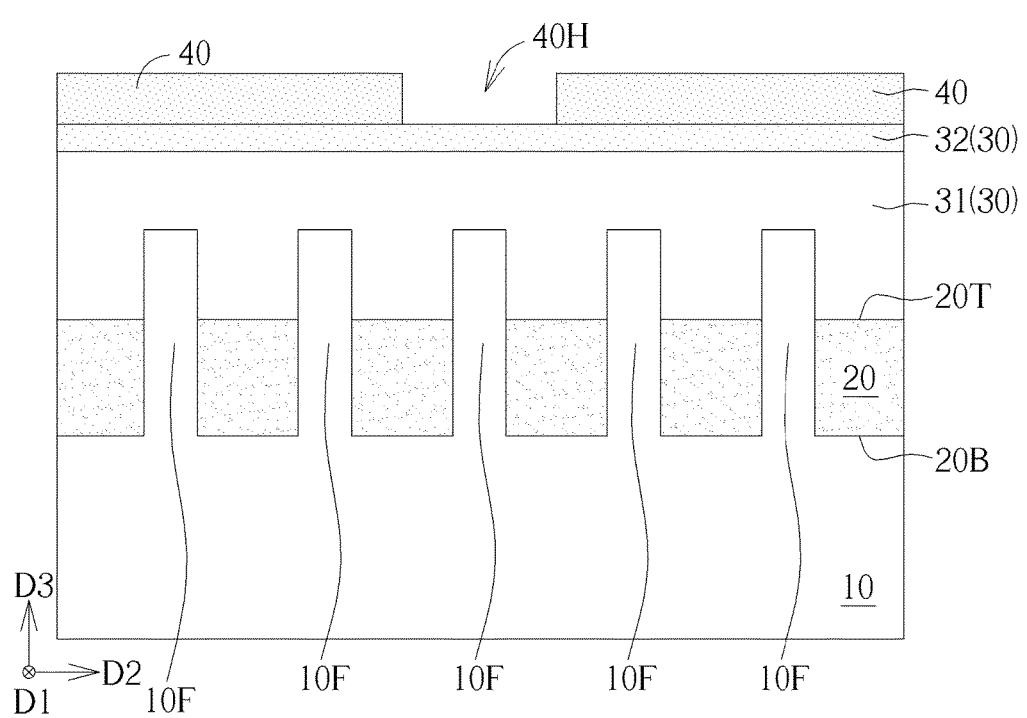
Figure 5:
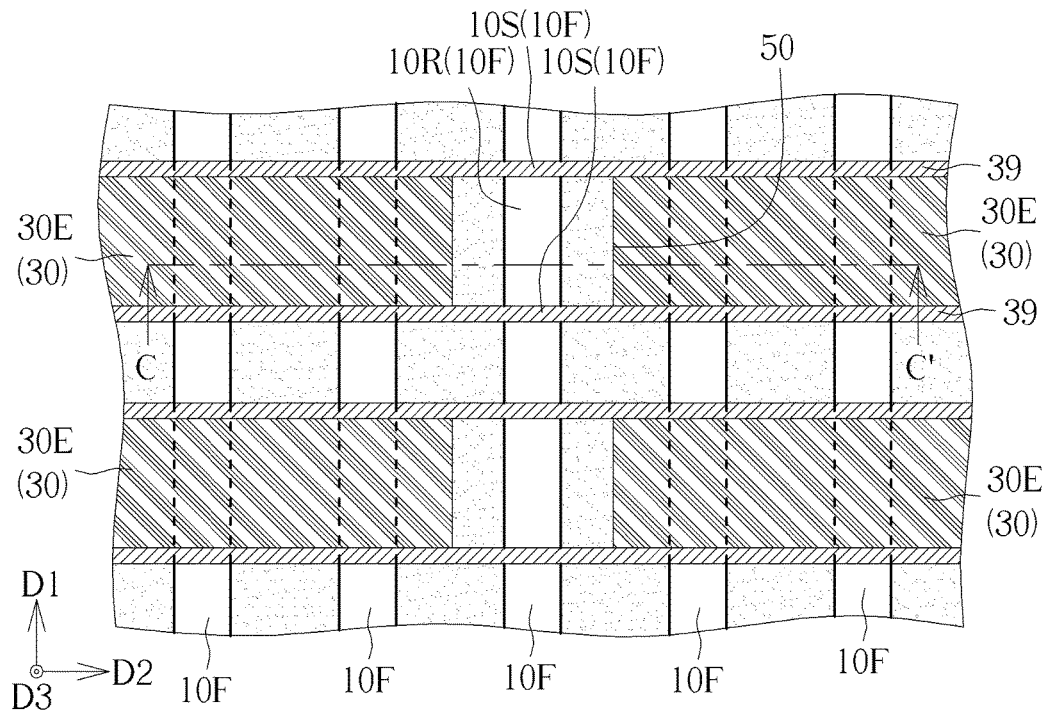
Figure 6:
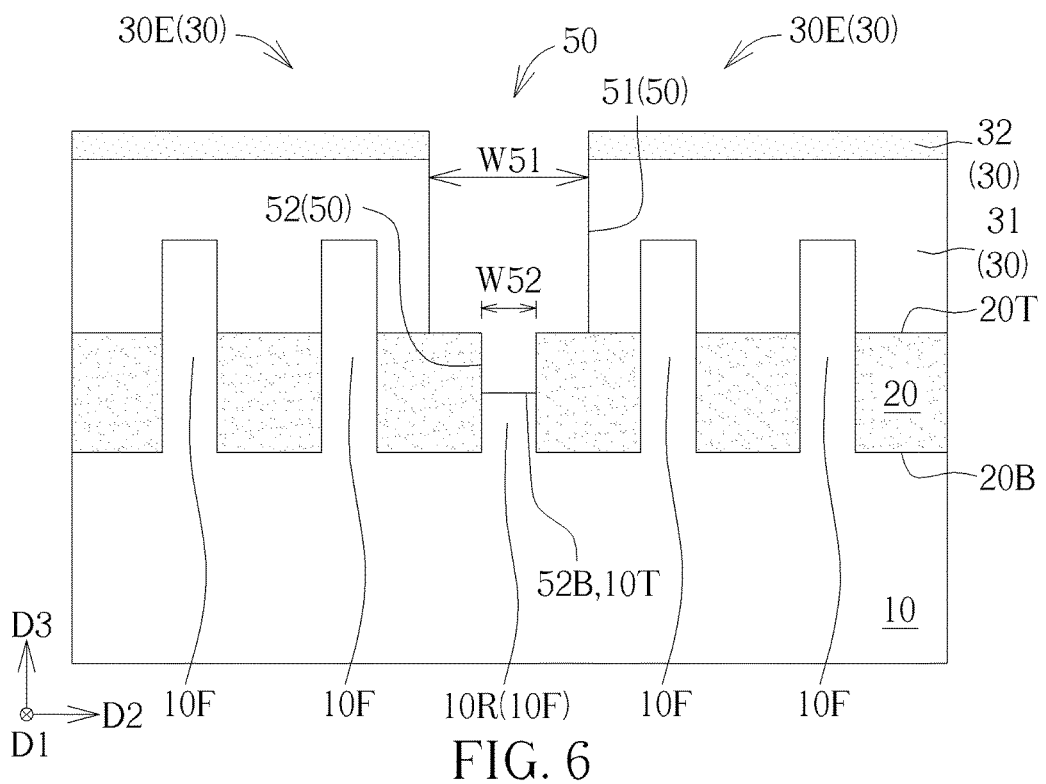
Figure 7:
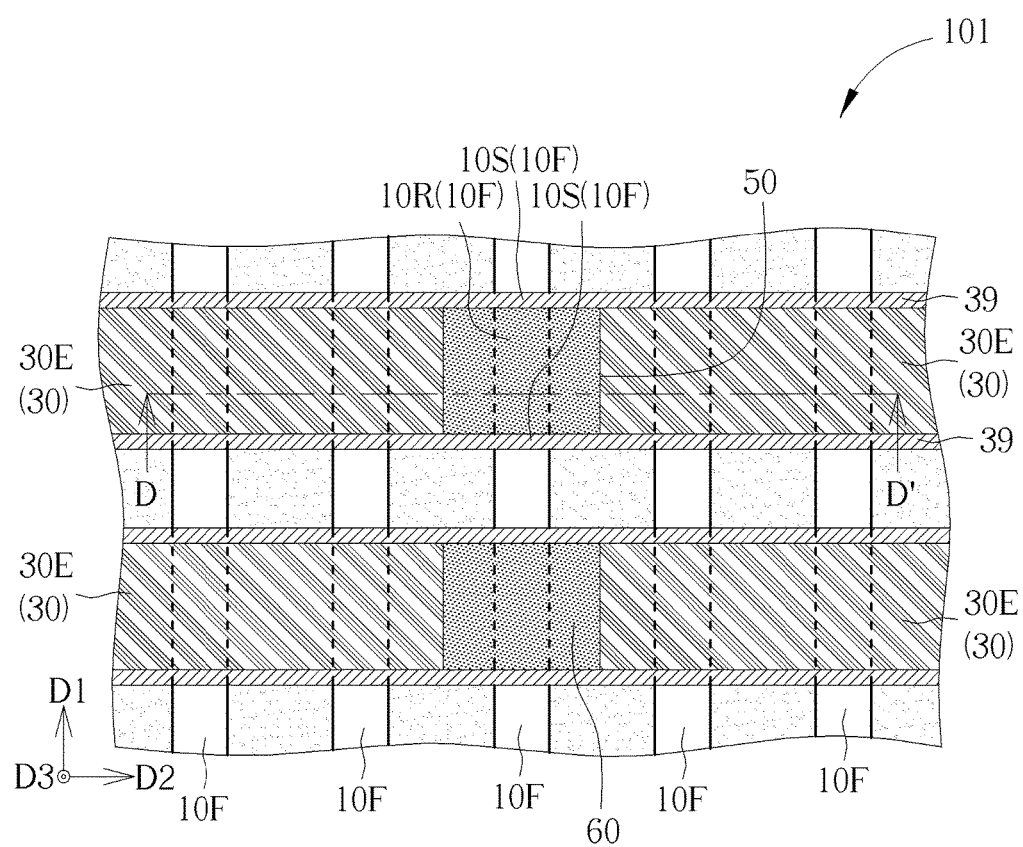
Figure 8:
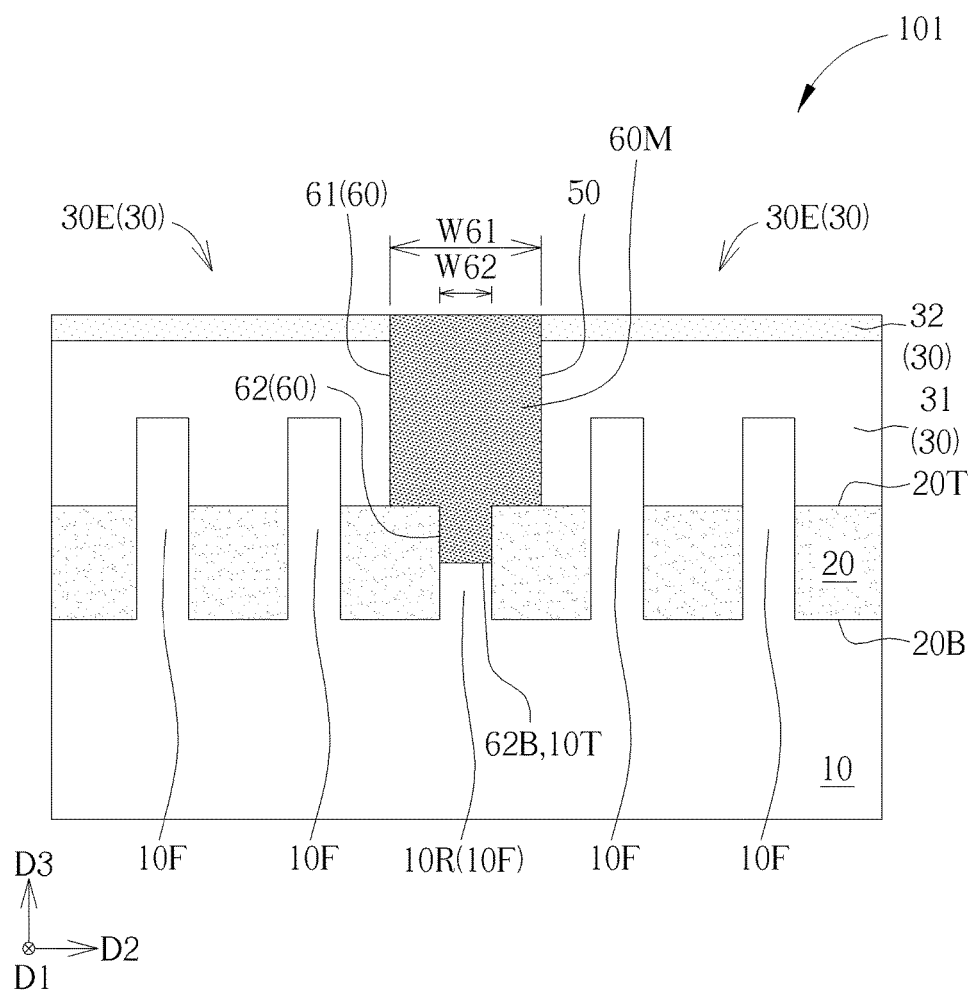

Please refer to FIGS. 1-8. FIGS. 1-8 are schematic drawings illustrating a manufacturing method of a semiconductor device according to a first embodiment of the present invention. FIG. 1, FIG. 3, FIG. 5, and FIG. 7 are top-view diagrams. FIG. 2 is a cross-sectional diagram taken along a line A-A' in FIG. 1. FIG. 4 is a cross-sectional diagram taken along a line B-B' in FIG. 3. FIG. 6 is a cross-sectional diagram taken along a line C-C' in FIG. 5. FIG. 8 is a cross-sectional diagram taken along a line D-D' in FIG. 7. The manufacturing method of the semiconductor device in this embodiment includes the following steps. As shown in FIG. 1 and FIG. 2, a semiconductor substrate 10 is provided. The semiconductor substrate 10 includes a plurality of fin structure 10F, and each of the fin structures 10F is elongated in a first direction D1. Additionally, the fin structures 10F may be repeatedly disposed in a second direction D2, and the first direction D1 may be substantially orthogonal to the second direction D2, but not limited thereto. The semiconductor substrate 10 in this embodiment may include a silicon substrate, an epitaxial silicon substrate, a silicon germanium substrate, a silicon carbide substrate, or a silicon-on-insulator (SOI) substrate, but not limited thereto. The fin structures 10F may be formed by performing a patterning process, such as a multiple exposure process, to the semiconductor substrate 10. Subsequently, a shallow trench isolation (STI) structure 20 is formed on the semiconductor substrate 10. The shallow trench isolation structure 20 is located between the fin structures 10F. The materials of the shallow trench isolation structure 20 may include silicon oxide or other appropriate insulation materials. The method of forming the shallow trench isolation structure 20 may include but is not limited to the following steps. Firstly, an insulation material is formed for covering the fin structures 10F. Subsequently, the excess insulation material may be removed by a process such as a chemical mechanical polishing (CMP) process so as to make a height of the insulation material substantially equal to a height of the fin structures 10F in a vertical direction D3. A recessing process is then performed to the insulation material for reducing the height of the insulation material in the vertical direction D3 and forming the shallow trench isolation structure 20. Accordingly, an upper part of the fin structure 10F is exposed outside the shallow trench isolation structure 20. In other words, the top surface of each of the fin structures 10F is higher than the top surface of the shallow trench isolation structure 20 (such as a first top surface 20T shown in FIG. 2).

A plurality of gate structures 30 is then formed on the semiconductor substrate 10 and the shallow trench isolation structure 20. Each of the gate structures 30 may be elongated in a second direction D2, and each of the gate structures 30 is disposed straddling at least one of the fin structures 10F. In some embodiments, each of the gate structures 30 may include a gate material layer 31 and a capping layer 32. The gate material layer 31 may include polysilicon, amorphous silicon, metal materials, or other suitable gate materials. For example, each of the gate structures 30 may be a dummy gate structure for performing a replacement metal gate (RMG) process subsequently, but not limited thereto.

As shown in FIGS. 3-8, a gate isolation structure 60 is formed. The gate isolation structure 60 is formed cutting at least one of the gate structures 30 into two gate electrodes 30E. A bottom surface of the gate isolation structure 60 (such as a third bottom surface 62B shown in FIG. 8) is lower than the first top surface 20T of the shallow trench isolation structure 20. The manufacturing method of the gate isolation structure 60 in this embodiment may include but is not limited to the following steps. As shown in FIG. 3 and FIG. 4, a patterned mask layer 40 is formed. The patterned mask layer 40 covers a part of the gate structures 30 and a part of the shallow trench isolation structure 20. The patterned mask layer 40 may include an opening 40H, and the opening 40H exposes a part of the gate structures 30. Additionally, a sidewall spacer 39 may be formed on the sidewall of each of the gate structures 30 before the step of forming the patterned mask layer 40, but not limited thereto. In some embodiments, the opening 40H may be elongated in the first direction D1 and exposed a part of the sidewall spacer 39 and a part of the fin structures 10F, but the present invention is not limited to this. In some embodiments, the opening 40H of the patterned mask layer 40 may expose a part of the gate structures 30 only without exposing the sidewall spacer 39 and/or the fin structures 10F.

As shown in FIGS. 3-6, an etching process with the patterned mask layer 40 as a mask is performed for forming a recess 50. The recess 50 penetrates the gate structure 30 corresponding to the gate isolation structure formed subsequently (not shown in FIGS. 3-6). It is worth noting that, in some embodiments, the opening 40H of the patterned mask layer 40 may be formed corresponding to one of the fin structures 10F in the vertical direction D3, and the recess 50 formed by the patterned mask layer 40 is formed on the fin structure 10F. In addition, a part of the fin structure 10F is removed by the step of forming the recess 50. In other words, in some embodiments, the recess 50 is formed by removing a portion of the corresponding fin structure 10F after the step of removing a part of the gate structure 30 corresponding to the opening 40H. For example, the recess 50 may include a first part 51 and a second part 52. The second part 52 is located under the first part 51, and the second part 52 is connected with the first part 51. The first part 51 of the recess 50 is located in the gate structure 30, and the second part 52 is lower than the first top surface 20T of the shallow trench isolation structure 20, Specifically, the second part 52 may be regarded as a portion of the recess 50 lower than a horizontal plane where the first top surface 20T is located, and the first part 51 maybe regarded as a portion of the recess 50 penetrating the gate structure 30. For ensuring the alignment condition between the opening 40H of the patterned mask layer 40 and the fin structure 10F, a width of the opening 40H in the second direction D2 is larger than a width of the fin structure 10F preferably. Additionally, the first part 51 and the second part of the recess 50 may be formed self-aligned with each other, and a width of the first part 51 (such as a first width W51 shown in FIG. 6) is larger than a width of the second part 52 (such a second width 52W shown in FIG. 6) because the second part is formed by removing a part of the fin structure 10F (such as an upper part of the fin structure 10F), and the above-mentioned etching process of forming the recess 50 may have relatively higher etching selectivity between the fin structure 10F and the shallow trench isolation structure 20, but not limited thereto.

In this embodiment, a part of the fin structure 10F is removed by the step of forming the recess 50 for forming a recessed part 10R in the fin structure 10F, and the recessed part 10R is formed corresponding to the recess 50 in the vertical direction D3 accordingly. Additionally, in this embodiment, a top surface of the recessed part 10R (such as a second top surface 10T shown in FIG. 6) is lower than the first top surface 20T of the shallow trench isolation structure 20, but the second top surface 10T of the recessed part 10R is still higher than a bottom surface of the shallow trench isolation structure 20 (such as a first bottom surface 20B shown in FIG. 6). Therefore, a bottom surface of the second part 52 of the recess 50 (such as a second bottom surface 52B shown in FIG. 6) is also lower than the first top surface 20T of the shallow trench isolation structure 20 and higher than the first bottom surface 20B of the shallow trench isolation structure 20.

As shown in FIG. 7 and FIG. 8, the recess 50 is filled with an insulation material 60M for forming the gate isolation structure 60. The insulation material 60M may include silicon oxide, silicon nitride, silicon oxynitride, or other suitable insulation materials. The gate isolation structure 60 is formed on the recessed part 10R of the fin structure 10F corresponding to the recess 50 because the gate isolation structure 60 is formed by filling the recess 50 mentioned above with the insulation material 60M. The gate isolation structure 60 may include a first section 61 located in the above-mentioned first part of the recess 50 and a second section 62 located in the above-mentioned second part of the recess 50. The first section 61 of the gate isolation structure 60 is directly connected to the second section 62 of the gate isolation structure 60, and the second section 62 is disposed under the first section 61. The second section 62 is lower than the first top surface 20T of the shallow trench isolation structure 20. Additionally, in some embodiments, the sidewall spacer 39 may not be etched by the above-mentioned etching process of forming the recess 50 or the etching process of forming the recess 50 may have relatively lower etching rate to the sidewall spacer 39. Therefore, the fin structure 10F corresponding to the recess 50 may be cut into two sub fin structures 10S disposed under the sidewall spacer 39 by the recess 50, and the two sub fin structures 10S are separated from each other by the gate isolation structure 60. In other words, the fin structure 10F corresponding to the gate isolation structure 60 may include the recessed part 10R and two sub fin structures 10S, and the two sub fin structures 10S is disposed adjacent to each other in the first direction D1. The recessed part 10R is disposed between the two sub fin structures 10S in the first direction D1, and the gate isolation structure 60 is disposed on the recessed part 10R. Therefore, the gate isolation structure 60 is disposed between the two sub fin structures 10S in the first direction D1. In some embodiments, a portion of the fin structure 10F which is not covered by the gate structure 30 and is exposed by the opening of the patterned mask layer may also be partially etched by the etching process of forming the recess 50. In other words, the etching process for forming the recess 50 may also be used to providing a fin cut effect to a part of the fin structures 10F at the same time, and the gate isolation structure 60 may also be used as a diffusion break for isolating two adjacent semiconductor units (such as fin field effect transistors) disposed on the same fin structure 10F. The purposes of integration and simplification of the structure and the manufacturing process may be achieved accordingly.

A semiconductor device 101 shown in FIG. 7 and FIG. 8 may be formed by the manufacturing method described above. The semiconductor device 101 includes the semiconductor substrate 10, the shallow trench isolation structure 20, a plurality of the gate electrodes 30E, and the gate isolation structure 60. The semiconductor substrate 10 includes a plurality of the fin structures 10F, and each of the fin structures 10F is elongated in the first direction D1. The shallow trench isolation structure 20 is disposed on the semiconductor substrate 10 and disposed between the fin structures 10F. The gate electrodes 30E are disposed on the semiconductor substrate 10 and the shallow trench isolation structure 20. Each of the gate electrodes 30E is elongated in the second direction D2 and disposed straddling at least one of the fin structures 10F. The gate isolation structure 60 is disposed between two of the gate electrodes 30E adjacent with one another in the second direction D2. The third bottom surface 62B of the gate isolation structure 60 is lower than the first top surface 20T of the shallow trench isolation structure 20 in the vertical direction D3. As the manufacturing method described above, the gate isolation structure 60 in this embodiment includes the first section 61 and the second section 62 disposed under the first section 61. A part of the first section 61 is disposed on the shallow trench isolation structure 20, and the second section 62 is disposed in the shallow trench isolation structure 20. A width of the first section 61 in the second direction D2 (such as a fourth width W61 shown in FIG. 8) is larger than a width of the second section 62 (such as s fifth width W62 shown in FIG. 8). Additionally, a bottom surface of the second section 62 (such as the third bottom surface 62B shown in FIG. 8) is lower than the first top surface 20T of the shallow trench isolation structure 20 and higher than the first bottom surface 20B of the shallow trench isolation structure 20 because the gate isolation structure 60 in this embodiment is formed on the recessed part 10R of the corresponding fin structure 10F and the second top surface 10T of the recessed part 10R is lower than the first top surface 20T of the shallow trench isolation structure 20 and higher than the first bottom surface 20B of the shallow trench isolation structure 20 in the vertical direction D3. Additionally, as shown in FIG. 7 and FIG. 8, in some embodiments, the top surface gate isolation structure 60 and the top surface of the gate electrodes 30E may be substantially aligned at the same level by a planarization process, but not limited thereto. In addition, in a top view diagram (such as FIG. 7), the edge of the gate isolation structure 60 connected with the sidewall spacer 39 may be substantially aligned with the edges of the gate electrodes 30E, but not limited thereto.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 9:
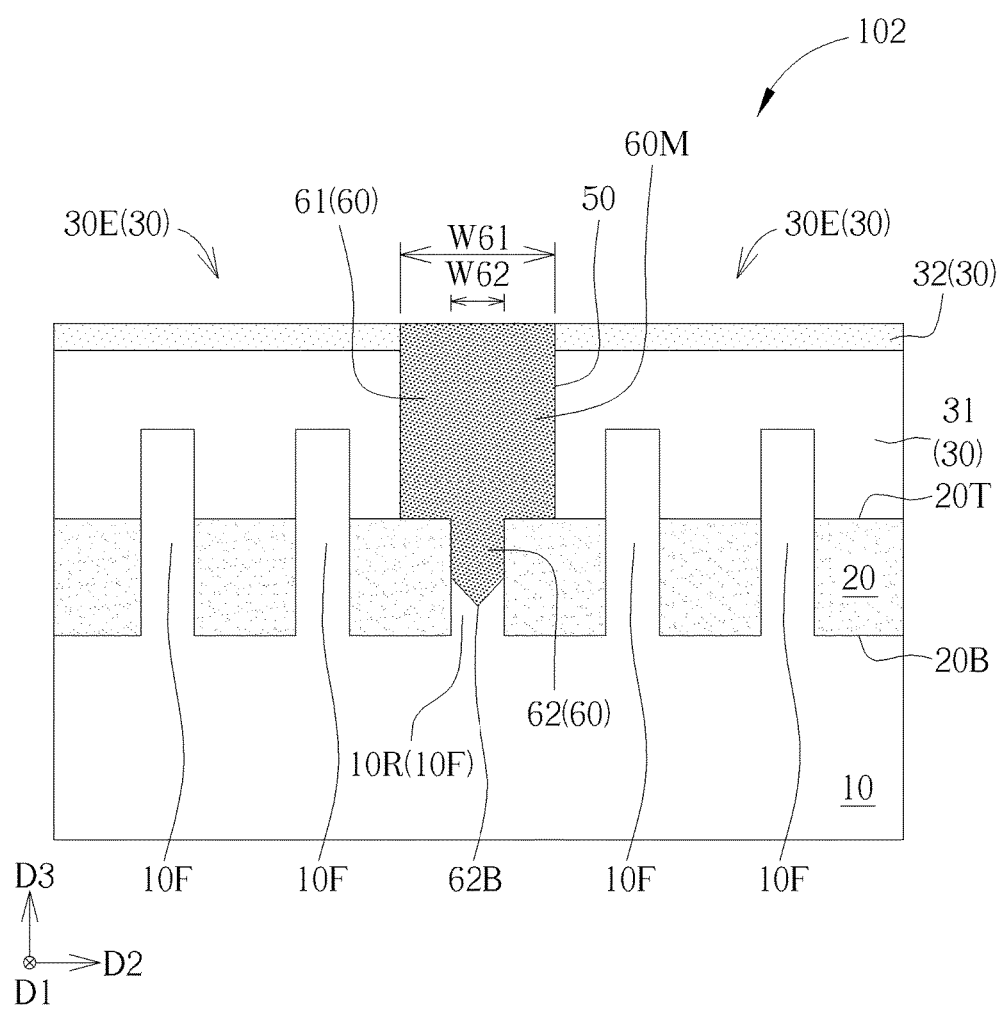
FIG. 9 is a schematic drawing illustrating a semiconductor device according to a second embodiment of the present invention.
Figure 10:
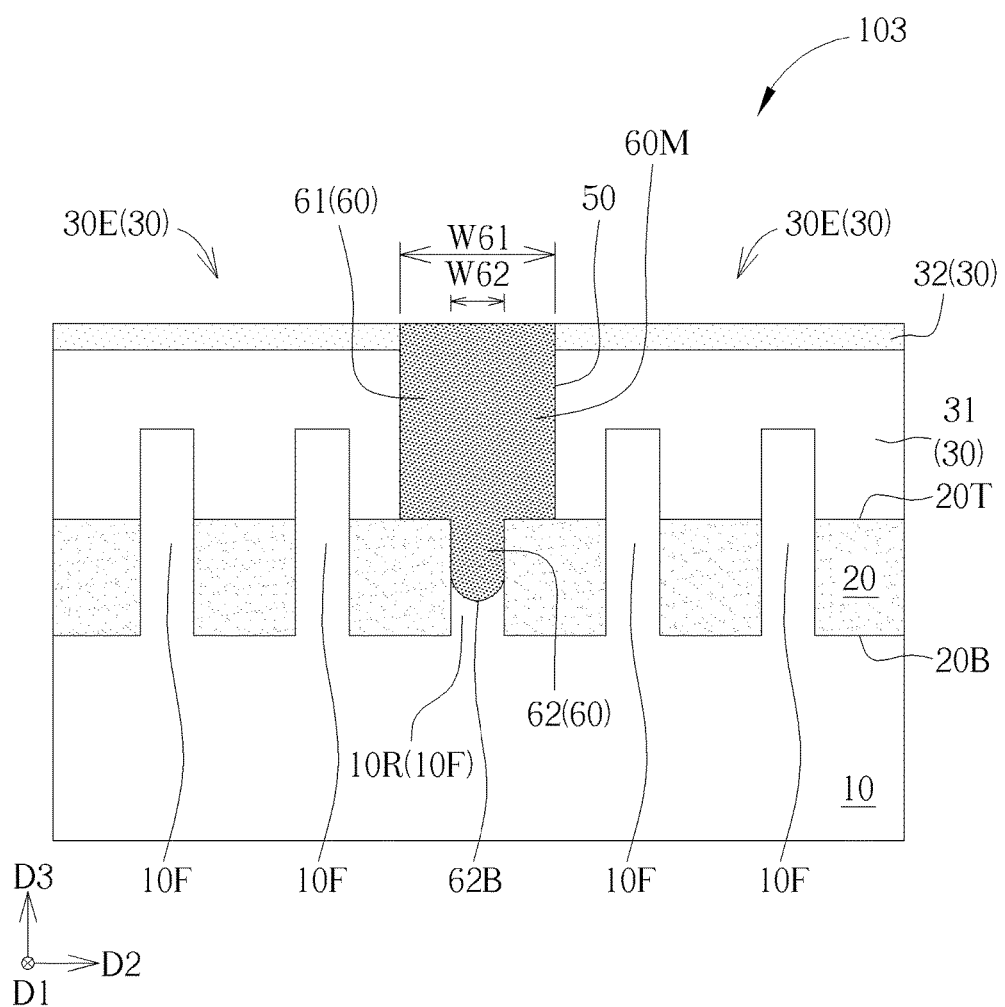
FIG. 10 is a schematic drawing illustrating a semiconductor device according to a third embodiment of the present invention.

Please refer to FIG. 9 and FIG. 10. FIG. 9 is a schematic drawing illustrating a semiconductor device 102 according to a second embodiment of the present invention. FIG. 10 is a schematic drawing illustrating a semiconductor device 103 according to a third embodiment of the present invention. As shown in FIG. 9 and FIG. 10, the third bottom surface 62B of the gate isolation structure 60 may have different shapes in accordance with the different etched conditions of the recesses part 10R of the fin structure 10F. For example, the third bottom surface 62B of the gate isolation structure 60 may be a sharp corner (as shown in FIG. 9), a rounded surface (as shown in FIG. 10), or other regular or irregular shapes.

Figure 11:
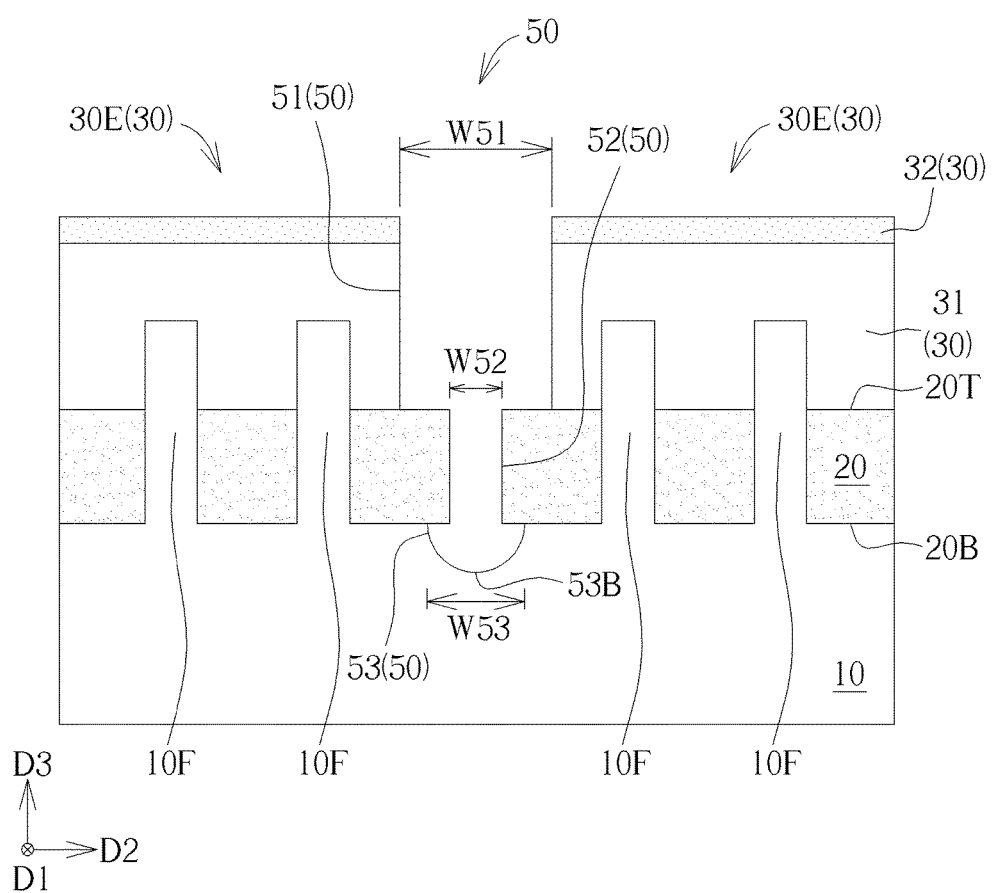
Figure 12:
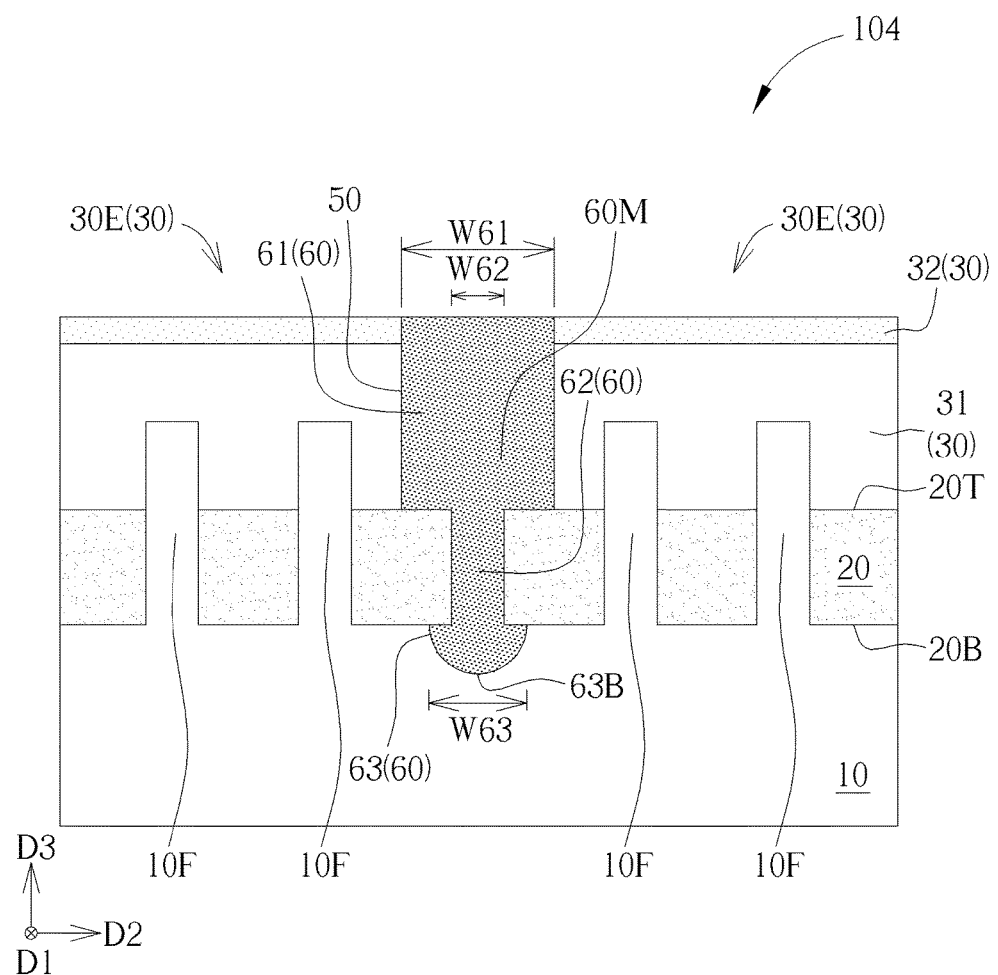

Please refer to FIG. 11 and FIG. 12. FIG. 11 and FIG. 12 are schematic drawings illustrating a manufacturing method of a semiconductor device 104 according to a fourth embodiment of the present invention. As shown in FIG. 11, the difference between the manufacturing method in this embodiment and the manufacturing method in the first embodiment is that the recess 50 in this embodiment further includes a third part 53 located under the second part 52, and a bottom surface of the third part 53 (such as a fourth bottom surface 53B shown in FIG. 11) is lower than the first bottom surface 20B of the shallow trench isolation structure 20 in the vertical direction D3. In other words, compared with the first embodiment mentioned above, the etching process of forming the recess 50 in this embodiment further etches towards the semiconductor structure 10 for forming the third part 53 in the semiconductor substrate 10, and a part of the fin structure 10F overlapping the recess 50 in the vertical direction D3 is completely removed by the etching process of forming the recess 50. Additionally, the shallow trench isolation structure 20 may not be etched by the above-mentioned etching process of forming the recess 50 or the etching process of forming the recess 50 may have relatively lower etching rate to the shallow trench isolation structure 20. Therefore, a width of the third part 53 in the second direction D2 (such as a third width W53 shown in FIG. 11) is larger than the second width W52 of the second section 52. As shown in FIG. 12, the recess 50 is filled with the insulation material 60M for forming the gate isolation structure 60. Therefore, compared with the first embodiment described above, the gate isolation structure 60 in the semiconductor device 104 of this embodiment further includes a third section 63 disposed under the second section 62. The third section 63 is directly connected to the second section 62, and the second section 62 is directly connected to the first section 61. Additionally, the third section 63 is lower than the first bottom surface 20B of the shallow trench isolation structure 20 in the vertical direction D3. A bottom surface of the third section 63 (such as a fifth bottom surface 63B shown in FIG. 12) is lower than the first bottom surface 20B of the shallow trench isolation structure 20 in the vertical direction D3. A width of the third section 63 (such as a sixth width 63W shown in FIG. 11) is larger than the fifth width W62 of the second section 62.

Figure 13:
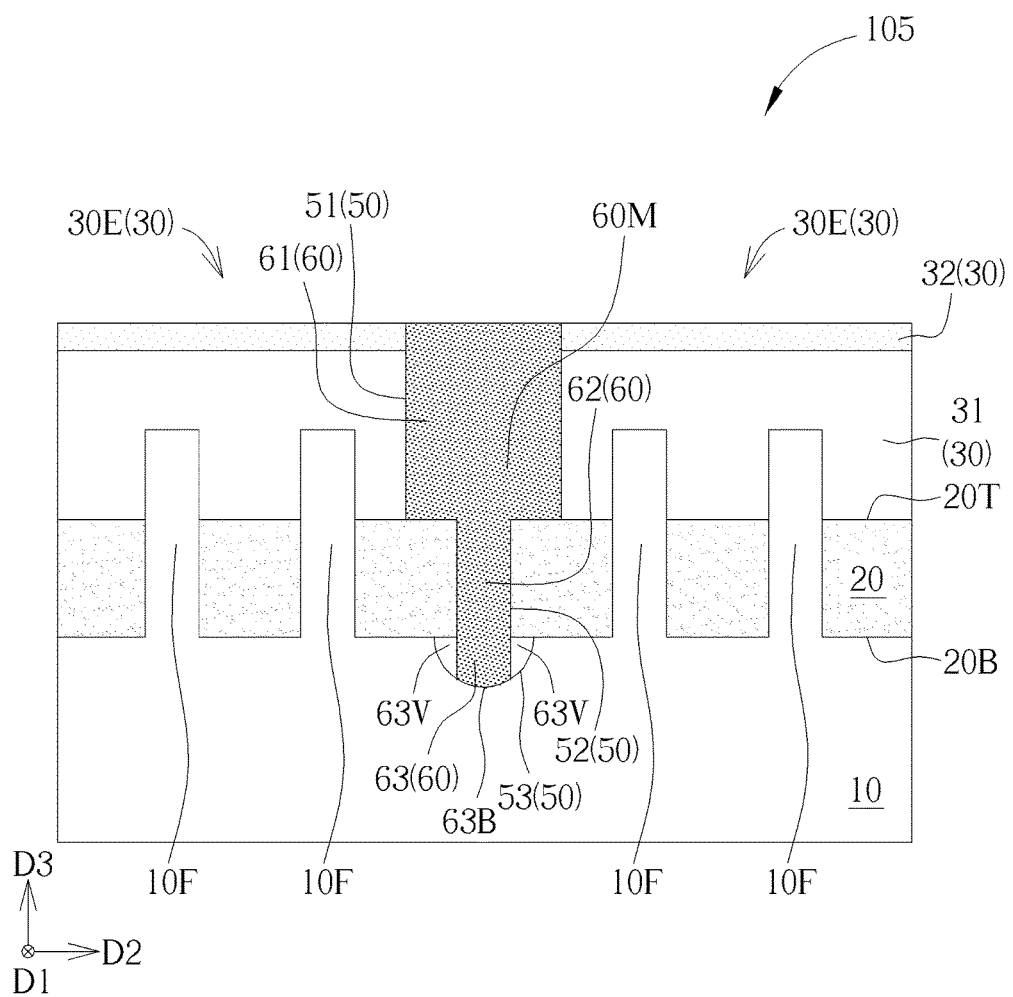
FIG. 13 is a schematic drawing illustrating a semiconductor device according to a fifth embodiment of the present invention.

Please refer to FIG. 13. FIG. 13 is a schematic drawing illustrating a semiconductor device 105 according to a fifth embodiment of the present invention. As shown in FIG. 13, the difference between the semiconductor device 105 in this embodiment and the semiconductor device in the fourth embodiment is that the third part 53 of the recess 50 is not filled with the third section 63 of the gate isolation structure 60. In other words, a void 63V may be formed in the third part 53 of the recess 50, and the void 63V in the third part 53 of the recess 50 may be formed adjacent to the third section 63 of the gate isolation structure 60.

Figure 14:
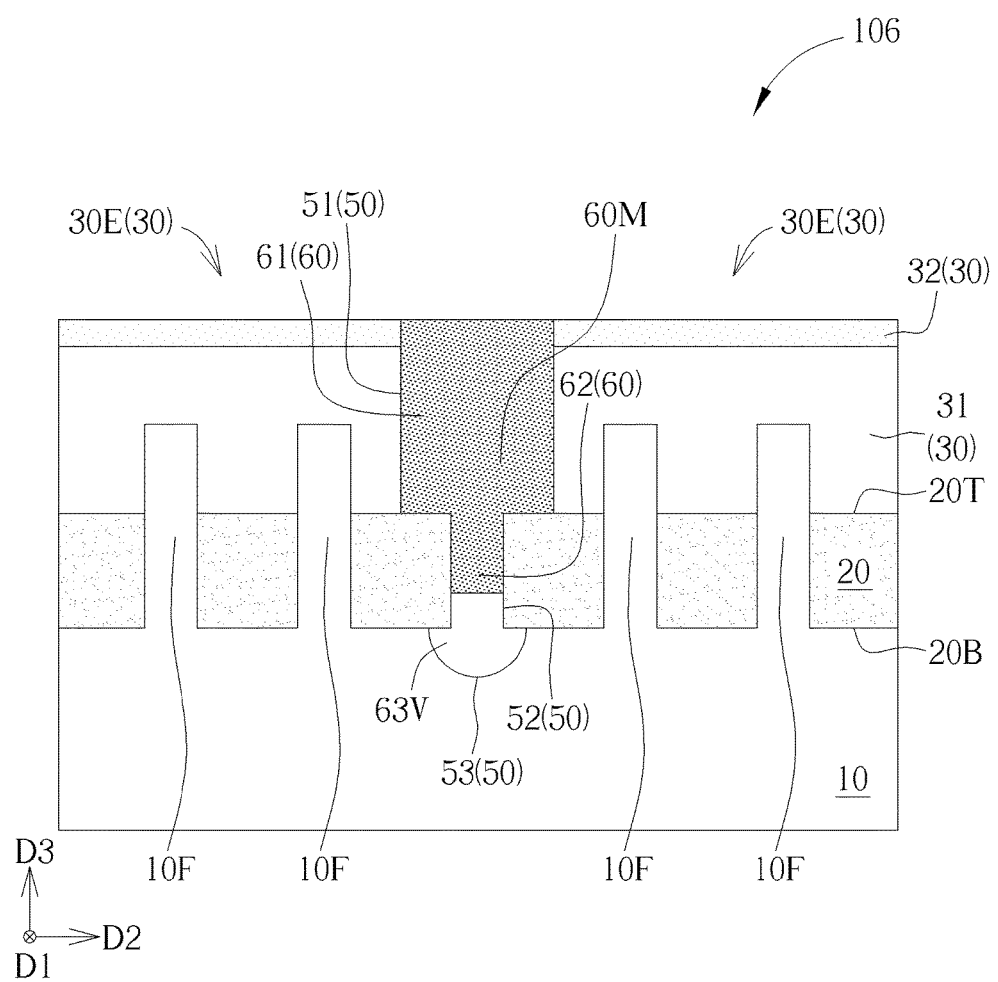
FIG. 14 is a schematic drawing illustrating a semiconductor device according to a sixth embodiment of the present invention.

Please refer to FIG. 14. FIG. 14 is a schematic drawing illustrating a semiconductor device 106 according to a sixth embodiment of the present invention. As shown in FIG. 14, the difference between the semiconductor device 106 in this embodiment and the semiconductor device in the fifth embodiment is that the void 63V in this embodiment is partly formed in the second part 52 of the recess 50 and partly formed in the third part 53 of the recess 50. In other words, the gate isolation structure 60 in this embodiment is not formed in the third part 53 of the recess 50.

Figure 15:
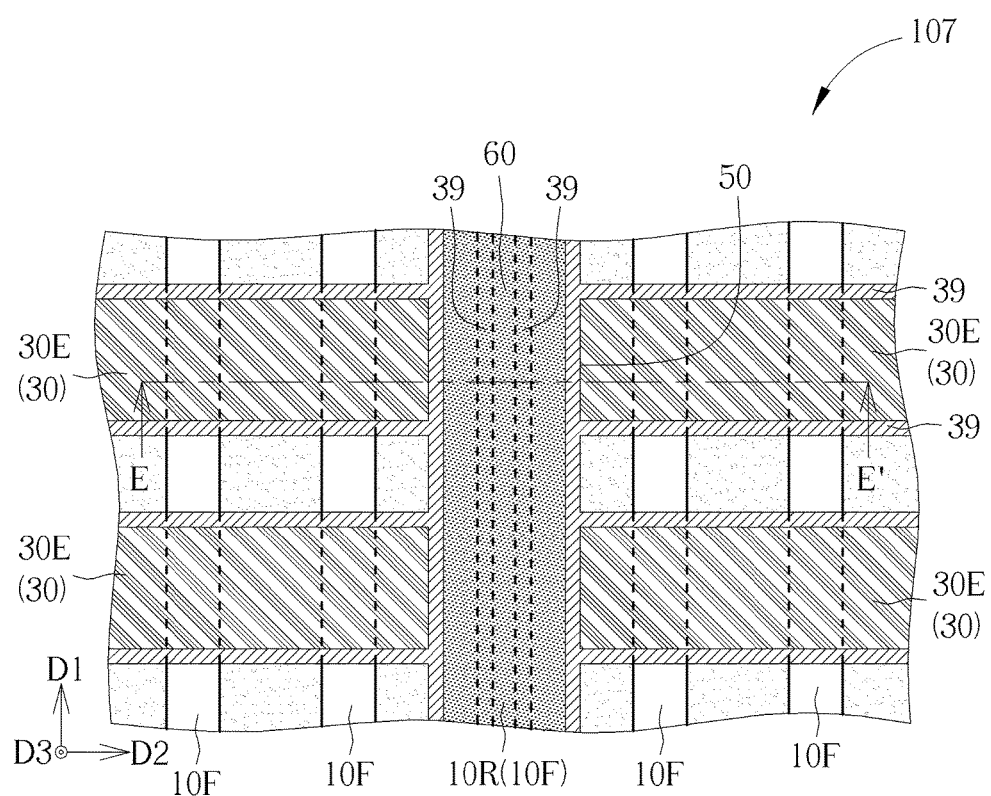
Figure 16:
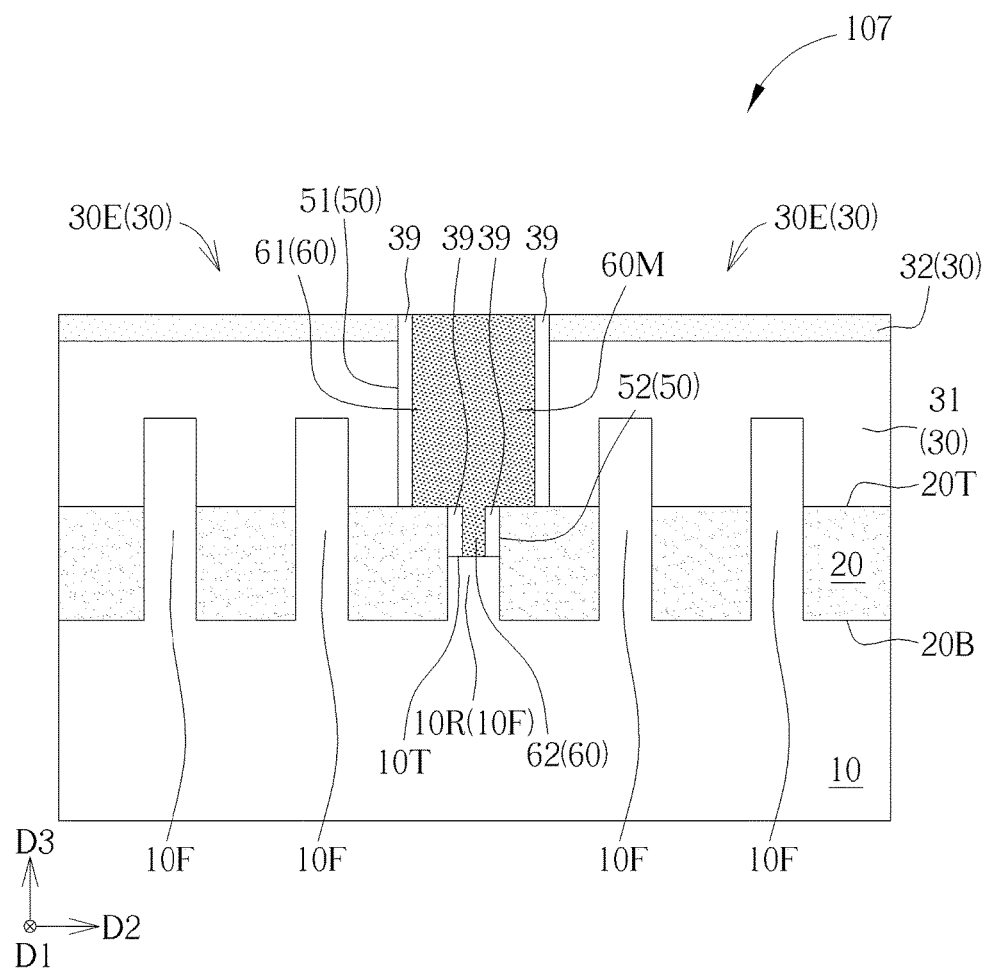

Please refer to FIG. 15 and FIG. 16. FIG. 15 and FIG. 16 are schematic drawings illustrating a semiconductor device 107 according to a seventh embodiment of the present invention. As shown in FIG. 15 and FIG. 16, the difference between the semiconductor device 107 in this embodiment and the semiconductor device in the first embodiment is that the sidewall spacer 39 is formed after the step of forming the recess 50. Accordingly, the sidewall spacer 39 in this embodiment may be further formed on the inner walls of the first part 51 and the second part 52 of the recess 50. In other words, a part of the sidewall spacer 39 may be disposed between the gate isolation structure 60 and the gate electrode 30E, and a part of the sidewall spacer 39 may be disposed between the gate isolation structure 60 and the shallow trench isolation structure 20.

Figure 17:
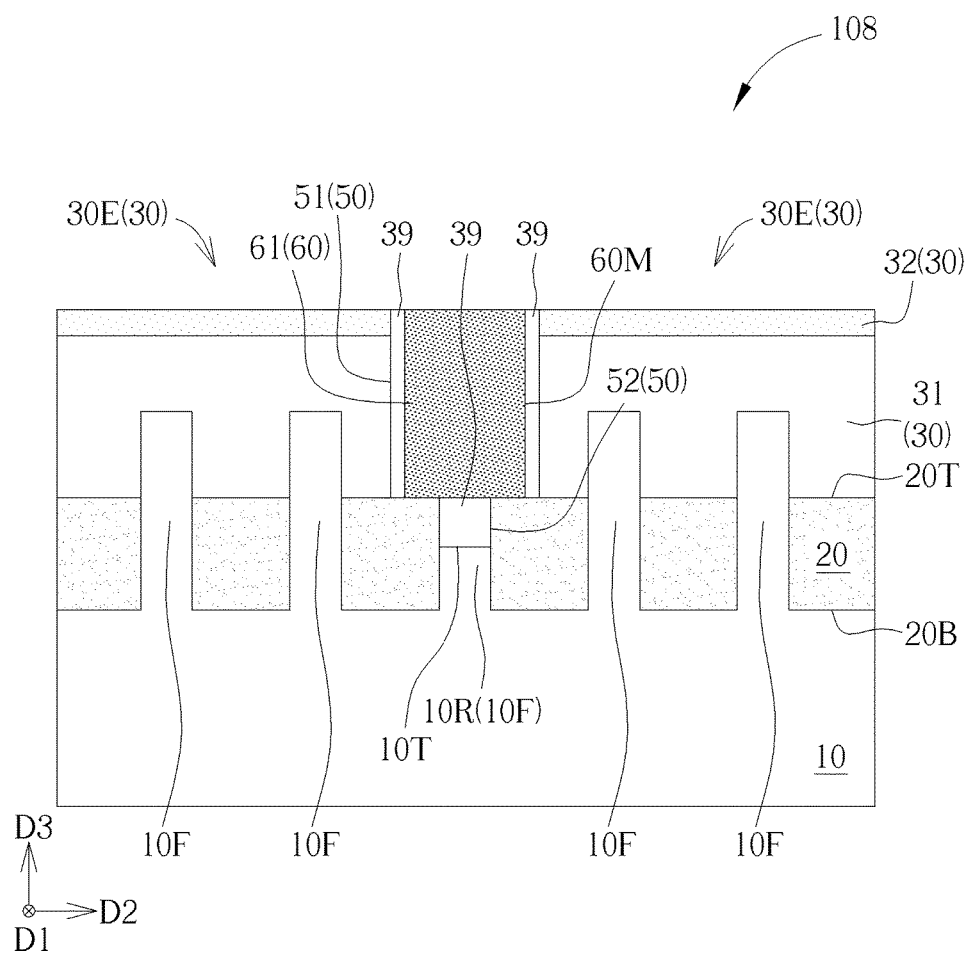
FIG. 17 is a schematic drawing illustrating a semiconductor device according to an eighth embodiment of the present invention.

Please refer to FIG. 17. FIG. 17 is a schematic drawing illustrating a semiconductor device 108 according to an eighth embodiment of the present invention. As shown in FIG. 17, the difference between the semiconductor device 108 in this embodiment and the semiconductor device in the seventh embodiment is that the second part 52 of the recess 50 in this embodiment may be filled with the sidewall spacer 39, and the gate isolation structure 60 is not formed in the second part 52 of the recess 50.

Figure 18:
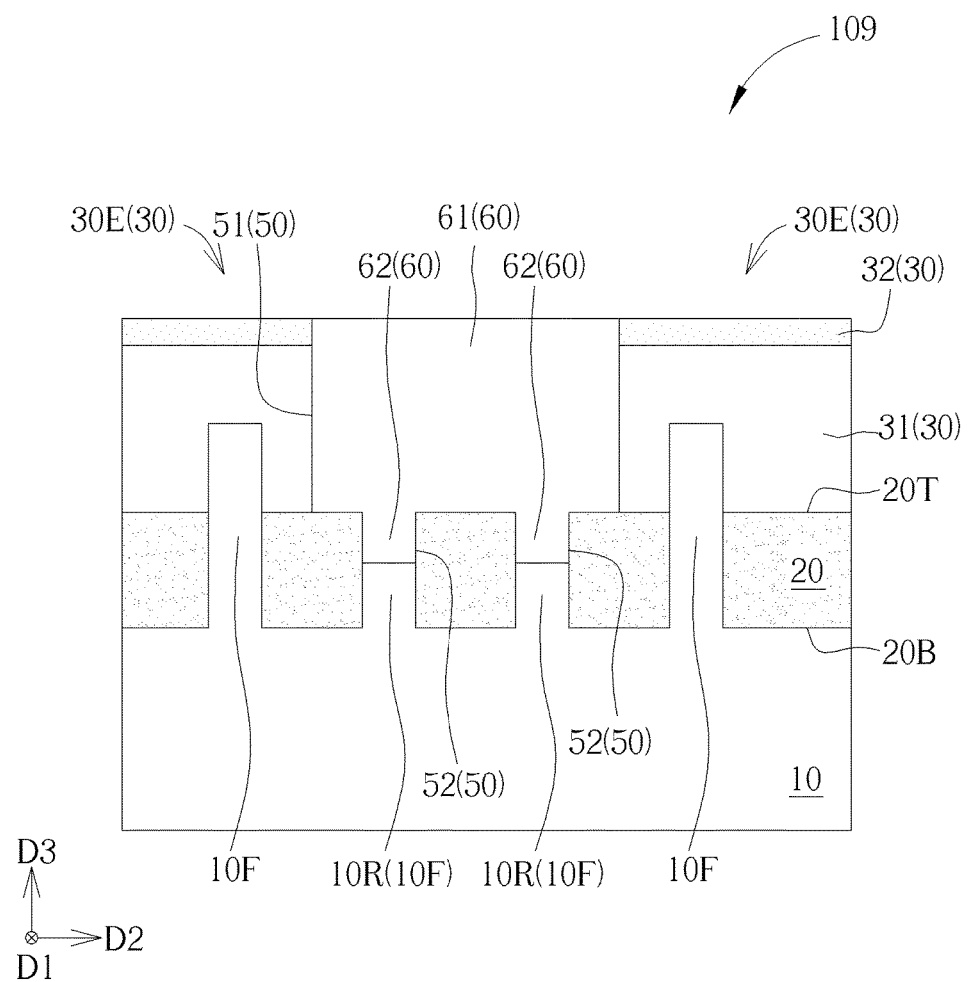
FIG. 18 is a schematic drawing illustrating a semiconductor device according to a ninth embodiment of the present invention.

Please refer to FIG. 18. FIG. 18 is a schematic drawing illustrating a semiconductor device 109 according to a ninth embodiment of the present invention. As shown in FIG. 18, the difference between the semiconductor device 109 in this embodiment and the semiconductor device in the first embodiment is that the recess 50 in this embodiment includes a plurality of the second parts 52 lower than a horizontal plane where the first top surface 20T is located, and the gate isolation structure 60 in this embodiment may include a plurality of the second sections 62 disposed in the second parts 52 of the recess 50 respectively. In other words, the recess 50 in this embodiment is formed corresponding to a plurality of the fin structures 10F disposed adjacent to one another, and the fin structures 10F corresponding to the recess 50 is partially removed by the step of forming the recess 50 for forming a plurality of the recessed parts 10R. The etching process for forming the recess 50 in this embodiment may also be used to providing a fin cut effect to a plurality of the fin structures 10F disposed adjacent to one another.

To summarize the above descriptions, in the semiconductor device and the manufacturing method thereof according to the present invention, the gate isolation structure isolating the adjacent gate electrodes extends towards the semiconductor substrate and is partly disposed lower than the top surface of the shallow trench isolation structure. Additionally, the gate isolation structure may be formed corresponding to an area of one fin structure in the vertical direction. Apart from separating the gate electrodes, the gate isolation structure may also be used to cut the fin structure in the semiconductor substrate and/or be used as a diffusion break for isolating two adjacent semiconductor units disposed on the same fin structure. The purposes of integration and simplification of the structure and the manufacturing process maybe achieved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A manufacturing method of a semiconductor device, comprising:
provide a semiconductor substrate, wherein the semiconductor substrate comprises a plurality of fin structures, and each of the fin structures is elongated in a first direction;
forming a shallow trench isolation structure on the semiconductor substrate, wherein the shallow trench isolation structure is located between the fin structures;
forming a plurality of gate structures on the semiconductor substrate and the shallow trench isolation structure, wherein each of the gate structures is elongated in a second direction and disposed straddling at least one of the fin structures; and forming a gate isolation structure cutting at least one of the gate structures into two gate electrodes, wherein a bottom surface of the gate isolation structure is lower than a top surface of the shallow trench isolation structure, and the step of forming the gate isolation structure comprises:

forming a recess penetrating the gate structure corresponding to the gate isolation structure, wherein the recess is formed on one of the fin structures, a part of the fin structure is removed by the step of forming the recess, and the recess comprises:
a first part;
a second part located under the first part, wherein the second part is lower than the top surface of the shallow trench isolation structure; and
a third part located under the second part, wherein a bottom surface of the third part is lower than a bottom surface of the shallow trench isolation structure; and
filling the recess with an insulation material.

2. The manufacturing method of claim 1, wherein a width of the first part is larger than a width of the second part.

3. The manufacturing method of claim 1, wherein a width of the third part is larger than a width of the second part.

4. The manufacturing method of claim 1, wherein the fin structure corresponding to the recess is cut into two sub fin structures by the recess.

5. The manufacturing method of claim 4, wherein the two sub fin structures are separated from each other by the gate isolation structure.

6. A manufacturing method of a semiconductor device, comprising:

providing a semiconductor substrate, wherein the semiconductor substrate comprises a plurality of fin structures, and each of the fin structures is elongated in a first direction;

forming a shallow trench isolation structure on the semiconductor substrate, wherein the shallow trench isolation structure is located between the fin structures;

forming a plurality of gate structures on the semiconductor substrate and the shallow trench isolation structure, wherein each of the gate structures is elongated in a second direction and disposed straddling at least one of the fin structures; and forming a gate isolation structure cutting at least one of the gate structures into two gate electrodes, wherein a bottom surface of the gate isolation structure is lower than a top surface of the shallow trench isolation structure, and the step of forming the gate isolation structure comprises:

forming a recess penetrating the gate structure corresponding to the gate isolation structure, wherein the recess is formed on one of the fin structures, a part of the fin structure is removed by the step of forming the recess, and the recess comprises:
a first part; and
a second part located under the first part, wherein the second part is lower than the top surface of the shallow trench isolation structure, and a bottom surface of the second part is higher than a bottom surface of the shallow trench isolation structure; and
filling the recess with an insulation material, wherein the part of the fin structure is removed by the step of forming the recess for forming a recessed part in the fin structure, the gate isolation structure is formed on the recessed part of the fin structure, and the recessed part of the fin structure is formed corresponding to the recess.

7. The manufacturing method of claim 6, wherein a width of the first part is larger than a width of the second part.

8. A semiconductor device, comprising:
a semiconductor substrate comprising a plurality of fin structures, wherein each of the fin structures is elongated in a first direction;
a shallow trench isolation structure disposed on the semiconductor substrate and disposed between the fin structures;
a plurality of gate electrodes disposed on the semiconductor substrate and the shallow trench isolation structure, wherein each of the gate electrodes is elongated in a second direction and disposed straddling at least one of the fin structures; and
a gate isolation structure disposed between two of the gate electrodes adjacent with one another in the second direction, wherein a bottom surface of the gate isolation structure is lower than a top surface of the shallow trench isolation structure, and the gate isolation structure comprises:
a first section;
a second section disposed under the first section, wherein the second section is lower than the top surface of the shallow trench isolation structure; and
a third section disposed under the second section, wherein the third section is lower than a bottom surface of the shallow trench isolation structure.

9. The semiconductor device of claim 8, wherein at least one of the fin structures comprises:
two sub fin structures disposed adjacent to each other in the first direction, wherein the gate isolation structure is disposed between the two sub fin structures in the first direction.

10. The semiconductor device of claim 8, wherein a width of the third section is larger than a width of the second section.

11. The semiconductor device of claim 8, wherein a part of the first section is disposed on the shallow trench isolation structure.

12. The semiconductor device of claim 11, wherein a width of the first section is larger than a width of the second section.

* * * * *